(12) United States Patent
Frey (10) Patent No.: US 7,569,927 B2
(45) Date of Patent: Aug. 4, 2009

(54) RF POWER TRANSISTOR PACKAGE

(75) Inventor: Richard B. Frey, Bend, OR (US)

(73) Assignee: Microsemi Corporation, Bend, OR (US)

( * ) Notice: Subject to any disclaimer, the term of this patent is extended or adjusted under 35 U.S.C. 154(b) by 16 days.

(21) Appl. No.: 11/233,180

(22) Filed: Sep. 21, 2005

(65) Prior Publication Data

US 2007/0096297 A1    May 3, 2007

(51) Int. Cl.
 *H01L 23/34* (2006.01)
(52) U.S. Cl. .............................. 257/706; 257/E21.499
(58) Field of Classification Search ................ 257/726, 257/502–503, 703–710, 718–720, 727, 724, 257/678, 691, 712, 784, 589; 438/197, 106, 438/117, 107
See application file for complete search history.

(56) References Cited

U.S. PATENT DOCUMENTS

| | | | |
|---|---|---|---|
| 4,639,760 | A | 1/1987 | Granberg et al. |
| 4,781,612 | A | 11/1988 | Thrush |
| 4,845,545 | A | 7/1989 | Abramowitz et al. |
| 5,798,744 | A | 8/1998 | Tanaka et al. |
| 5,850,104 | A * | 12/1998 | Avis ............................ 257/726 |
| 6,130,821 | A | 10/2000 | Gerber |
| 6,181,006 | B1 * | 1/2001 | Ahl et al. ..................... 257/712 |
| 6,392,298 | B1 | 5/2002 | Leighton et al. |
| 6,566,749 | B1 | 5/2003 | Joshi et al. |
| 6,656,754 | B1 | 12/2003 | Farnworth et al. |
| 6,731,002 | B2 * | 5/2004 | Choi ........................... 257/735 |
| 6,833,566 | B2 | 12/2004 | Suehiro et al. |
| 6,849,942 | B2 | 2/2005 | Lin et al. |
| 6,890,845 | B2 | 5/2005 | Standing et al. |
| 7,067,392 | B2 * | 6/2006 | Yamazaki et al. ........... 438/455 |
| 2004/0135247 | A1 | 7/2004 | Takashima et al. |
| 2006/0087026 | A1 * | 4/2006 | Cao et al. .................... 257/706 |
| 2006/0279934 | A1 | 12/2006 | Schlomann |
| 2007/0235866 | A1 | 10/2007 | Schlomann |

FOREIGN PATENT DOCUMENTS

WO          99/21225  A1    4/1999

OTHER PUBLICATIONS

Advanced Power Technology, "RF Power Mosfet, ARF1500", Rev. Feb. 2005, Product Technical Data (3 pages).
Power Compact S.A., "Power Hybrid Modules Data Book 1992," pp. L 14-L17, B1-B2; C2.
Advanced Power Technology Europe, Power Compact Modules, Application Specific Power Modules ASPM, Product Catalog, Jun. 1994, Merignac, France, pp. 3-15.

* cited by examiner

*Primary Examiner*—Brook Kebede
*Assistant Examiner*—Tony Tran
(74) *Attorney, Agent, or Firm*—Marger Johnson & McCollom, P.C.

(57) ABSTRACT

An RF power transistor package with a rectangular ceramic base can house one or more dies affixed to an upper surface of the ceramic base. Source leads attached to the ceramic base extend from at least opposite sides of the rectangular base beneath a periphery of a non-conductive cover overlying the ceramic base. The cover includes recesses arranged to receive the one or more die, the ceramic base, gate and drain leads and a portion of the source leads. The cover further includes bolt holes arranged to clamp the ceramic base and source leads to a heat sink. Bosses at corners of the cover outward of the bolt holes exert a downward bowing force along the periphery of the cover between the bolt holes.

14 Claims, 5 Drawing Sheets

FIG 1A

PRIOR ART

FIG 1B

PRIOR ART

FIG 1C

PRIOR ART

RF POWER TRANSISTOR PACKAGE

TECHNICAL FIELD

This disclosure is related to RF power transistors and more specifically to power transistor packages.

BACKGROUND

Prior art high power RF power transistors utilize a ceramic substrate, typically made from Beryllium Oxide (BeO), onto which a die or an array of dies forming the circuitry of the device is affixed. The BeO substrate is mounted on expensive Copper-Tungsten (CuW) base which can then be mounted onto a heat sink. CuW is used for the base because of its high thermal performance having the ability to efficiently conduct heat from the BeO base to the heat sink and has the same coefficient of thermal expansion (CTE) as the BeO substrate and silicon die. This comparable CTE minimizes fatigue of the joining materials used at the different interfaces.

Figure 1A:
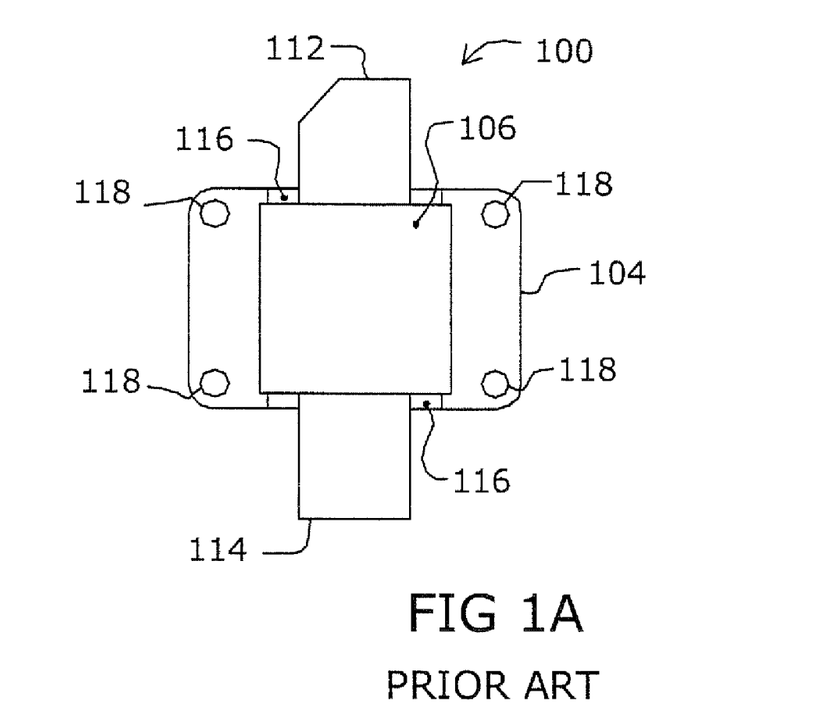
FIG. 1A is a top plan view of a prior art RF power transistor package.
Figure 1B:
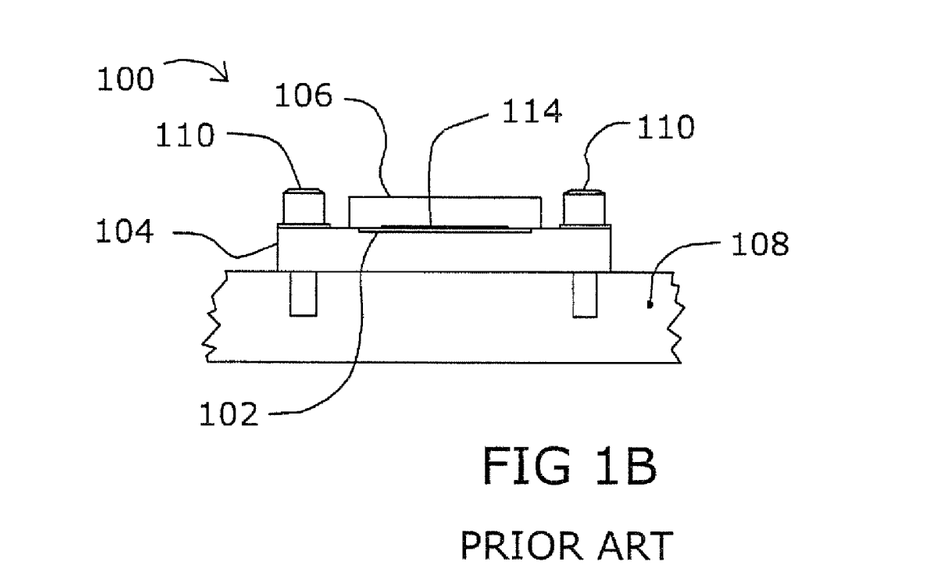
FIG. 1B is a side elevation view of the prior art package of FIG. 1A mounted on a heat sink.

An example of a prior art RF power transistor package 100 using a ceramic substrate 102 mounted on a CuW base 104 is shown in FIGS. 1A and 1B. The cover 106 overlies the ceramic substrate 104. To ensure an appropriate thermal path between the ceramic substrate 102 and the CuW base 104, the bottom of the ceramic base 102 must be metallized and then brazed to the CuW base 104. This example of an RF package 100 is an MRF154 RF MOSFET manufactured by M/A-COM.

The package 100 includes a drain lead 112 and a gate lead 114. The electrically conductive CuW base 104 also serves as the source lead for the RF package device 100. An insulator 102 separates the drain and gate leads 112, 114 from the CuW base 104, a shown in the side elevation view in FIG. 1B.

The CuW base 104, however, has a CTE different from that of the heat sink 108, which typically comprises Copper (Cu) or Aluminum (Al). The heat sink 108 expands and contracts more than the CuW base 104 as the device in package 100 controls power in cycles giving rise to numerous heat cycles seen in normal operation. As the heat sink 108 cools and contracts, the fasteners 110 mounting the CuW base 104 through holes 118 to the heat sink 108 constrain both materials from expanding and contracting freely to their natural extent and will deform the CuW base 104, causing the CuW base 104 to bow up and away from the heat sink 108, creating a gap between the CuW base 104 and the heat sink as time progresses. This bowing decreases the thermal performance of the CuW base 104 because less surface area of the bottom of the CuW base 104 is in contact with the heat sink 108. The bowing also causes the ceramic substrate 102 to separate from the CuW base 104, further reducing the thermal effectiveness of the CuW base to transfer heat from the ceramic substrate 102 to the heat sink 108, thereby decreasing the effective life of the package 100.

Figure 1C:
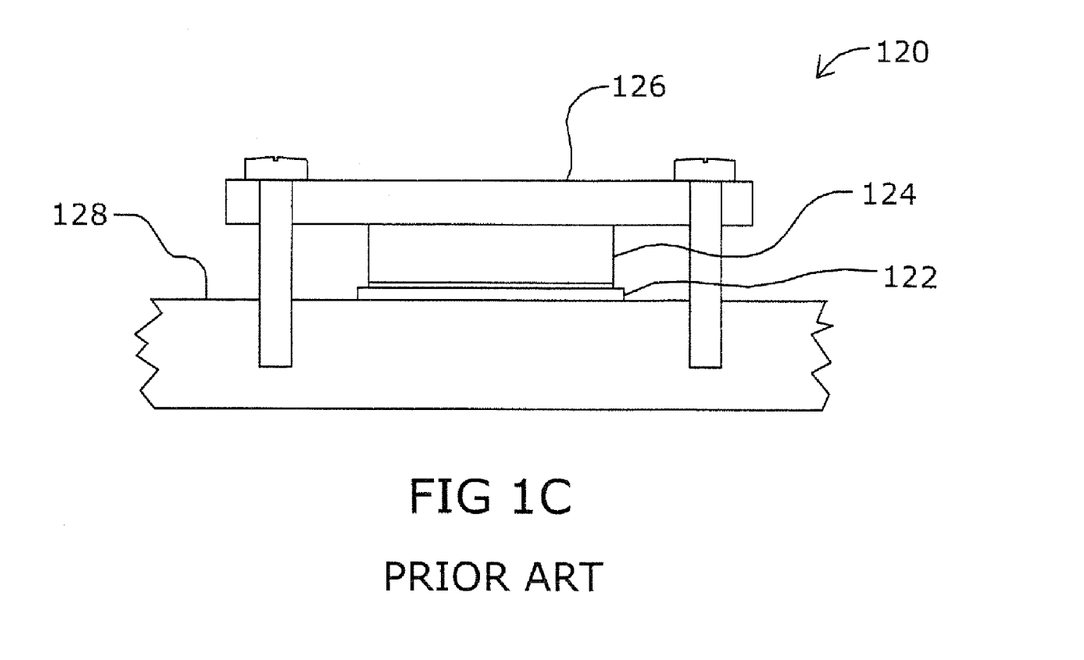
FIG. 1C is a side elevation view of another prior art RF power transistor package clamped to a heat sink.

An example of another prior art RF power transistor package 120 is shown in FIG. 1C. In this package 120, the CuW base is eliminated, with the ceramic substrate 122 also serving as the base for the package 120. The thermal path from the heat sink 128 to the ceramic substrate/base 122 is now direct. The clamp 126 overlying the cover 124 clamps the ceramic substrate/base 122 tightly against the heat sink 128 with fasteners 130. An example of such a package is an ARF 1500 RF Power MOSFET manufactured by Advanced Power Technology.

The clamp 126 may be made from any suitable strong material such as steel or aluminum. Clamp 126 holds the substrate/base 122 in tight contact with the heat sink 128 from above. In this construction, the substrate/base 122 is directly fastened together with the heat sink 128. The differential expansion rates between the ceramic base 122, typically made of BeO, and the heat sink causes the ceramic base 122 to polish or lap the interface surface and improve the thermal transfer between the base 122 and heat sink 128 over continued thermal cycles.

What is needed is a power resistor or transistor package that utilizes a ceramic substrate as a base that is kept in proper contact with a heat sink over the normal expected life of the device without using extra, separate clamping devices.

SUMMARY OF THE DISCLOSURE

One aspect of the disclosure is a power transistor package that includes a rectangular ceramic base, one or more die affixed to an upper surface of the ceramic base with source leads extending from one or two opposing sides of the rectangular base, gate and drain leads extending from the other two opposing sides of the rectangular base and a non-conductive cover that overlies the ceramic base and includes a recess therein to receive the one or more die, the ceramic base and the source leads.

The cover includes bolt holes arranged to secure the ceramic base and source leads to a heat sink. The cover can further include bosses protruding from the bottom surface of the cover corresponding to each mounting hole and arranged toward an outer perimeter of the cover, for example at the four corners of the cover positioned outwardly adjacent to and originating from the near the edge of each mounting hole.

Another aspect is an RF power transistor packaging system that includes a heat sink, a rectangular ceramic base including one or more die affixed to the top surface of the base with the ceramic base overlying the heat sink, source leads connected to and extending from opposite sides of the ceramic base and a non-conductive cover clamping the source leads to the ceramic base and clamping the ceramic base and portions of the source leads extending from the ceramic base onto the heat sink.

The foregoing and other features and advantages will become more apparent from the detailed description of a preferred embodiment, which proceeds with reference to the drawings.

DETAILED DESCRIPTION

Figure 2:
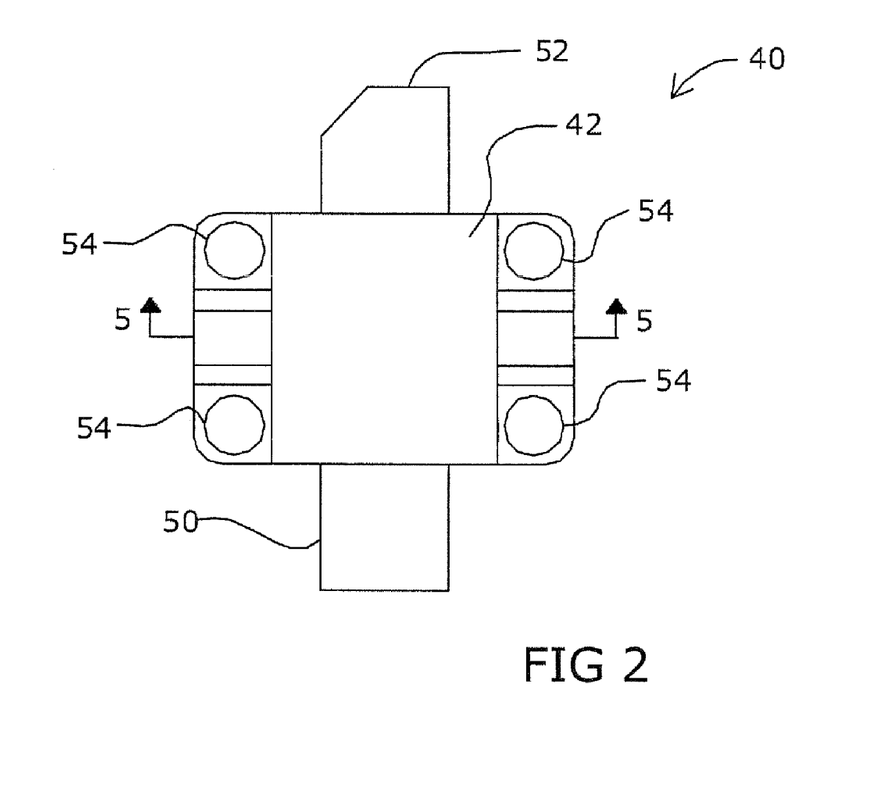
FIG. 2 is a top plan view of an RF power transistor package according to an embodiment of the invention.
Figure 3:
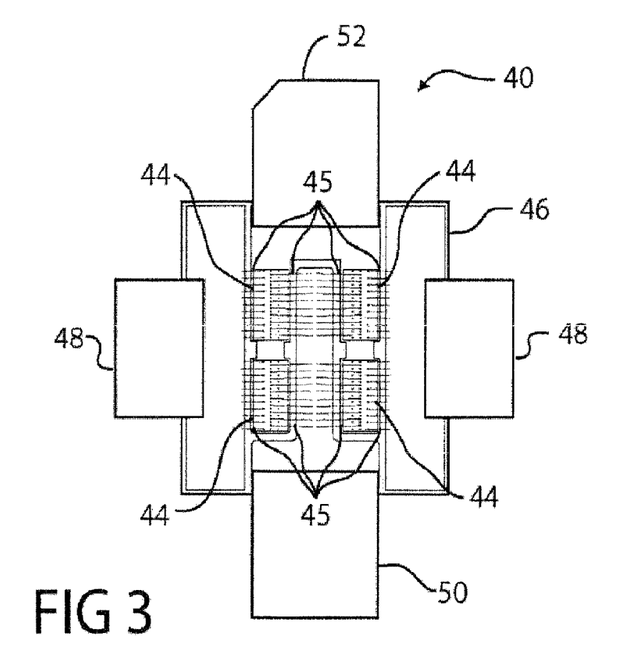
FIG. 3 is a top plan view of the package of FIG. 2 with the cover removed.

FIG. 2 is a top plan view of the RF power transistor package 40 according to an embodiment of the invention and FIG. 3 is a top plan view of the RF power transistor package 40 of FIG. 2 with the cover 42 removed. Referring to FIGS. 2-3, an array of four dies 44 are affixed to a top surface of the rectangular shaped ceramic base 46. The ceramic base 46 can be a substrate comprised of Beryllium Oxide. In the example, the package 40 is arranged rectangularly to support the array of four RF power MOSFET dies 44 that are electrically connected in parallel. More examples of multiple dies affixed to a ceramic substrate can be found in U.S. Pat. No. 6,939,743 to Frey which is incorporated by reference herein. Single die, two-die and other multiples of dies can be similarly packaged.

Source leads 48 are attached to the top of the ceramic base 46 and electrically connected to the dies 44 via jumper wires 45. The source leads 48 protrude from the ceramic base 46 on opposite sides of the rectangular base 46. Gate lead 50 and drain lead 52 are attached to the top surface of the ceramic base 46, electrically connected to the dies 44 and protrude in opposite directions from the other two sides of the rectangular-shaped ceramic base 46.

The terminology "gate," "source" and "drain" leads pertains to MOSFET type devices. It is contemplated that embodiments of the invention can also be used with bipolar type devices and IGBT devices. In the case of bipolar devices, gate corresponds to base, source corresponds to emitter and drain corresponds to collector. In the case of an IGBT device, gate remains gate, source corresponds to emitter and drain corresponds to collector. The terms gate, source and drain will be used throughout but are meant to include base-emitter-collector and gate-emitter-collector leads.

Figure 4:
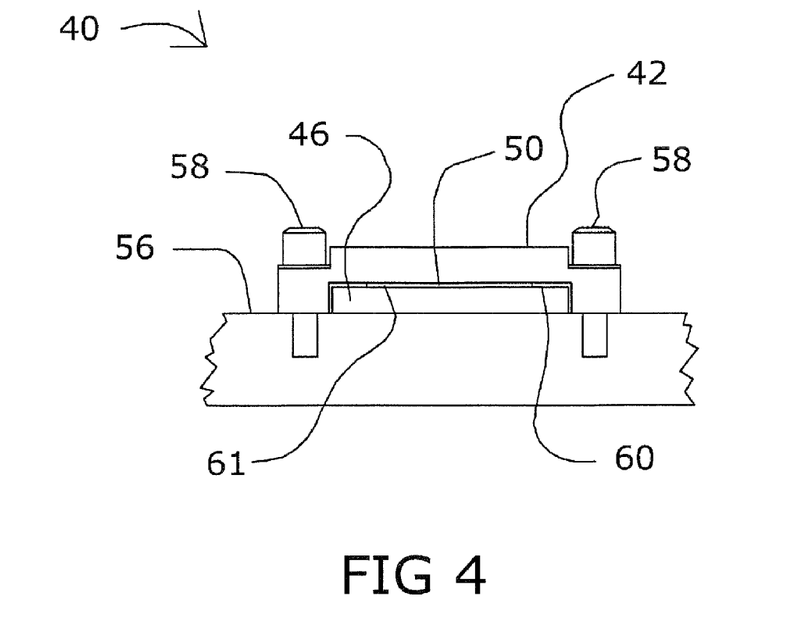
FIG. 4 is side elevation view of the package of FIG. 2 shown mounted on a heat sink.

Cover 42 is rectangularly shaped to cover the base 46, die 44, source leads 48, gate lead 50 and drain lead 52, providing a protective covering for these components. Mounting holes 54 are arranged at the corners of the cover 42 to receive screws 58 to secure the base 46 and source leads 48 against a heat sink 56, as shown in FIG. 4. The mounting holes 54 can be arranged in a pattern that matches the mounting pattern of preexisting RF power transistor packages or in entirely new mounting arrangements.

The cover 42 is made of a material selected to provide high electrical insulation with low dielectric loss since the cover contacts the source leads 48 and the gate and drain leads 50, 52. The cover material preferably has a high resistance to creep to avoid deformations caused by numerous heat cycles and high yield strength to maintain resistance to mechanical deformations. The cover may be made from a partially glass-filed polyetherimide such as the 30% glass-reinforced ULTEM® 2300 manufactured by GE Plastics. The cover may also be made from a partially glass reinforced liquid crystal polymer such as VECTRA® B130 manufactured by Polyplastics Co., Ltd.

FIG. 4 is a side elevation view of the RF power transistor package 40 showing the RF package 40 mounted on the heat sink 56 with fasteners 58. The cover 42 includes a recess 60, more clearly shown in FIG. 5, which includes a further stair-stepped recessed central die cavity 65 and is shaped to receive the dies 44, base 46, source leads 48, and gate and drain leads 50, 52. The recess 60 has a peripheral portion with depth slightly less than the thickness of the ceramic base 46. Typically a ceramic base 46 can have a thickness of 40 mils (1.016 mm) and the recess 60 can be shallower by 2-5 mils (0.051-0.127 mm). Doing so ensures a tight fit of the ceramic base 46 down onto the heat sink 56 when the fasteners 58 are tightened to a predetermined torque. The nominal torque value may typically be 10 inch-pounds (113 Newton-centimeters). Also, by making the recess 60 slightly shorter than the height of the base 46 and die 44, the cover 42 will remain tightly clamped onto the base 46 and die 44 through many heat cycles.

Figure 5:
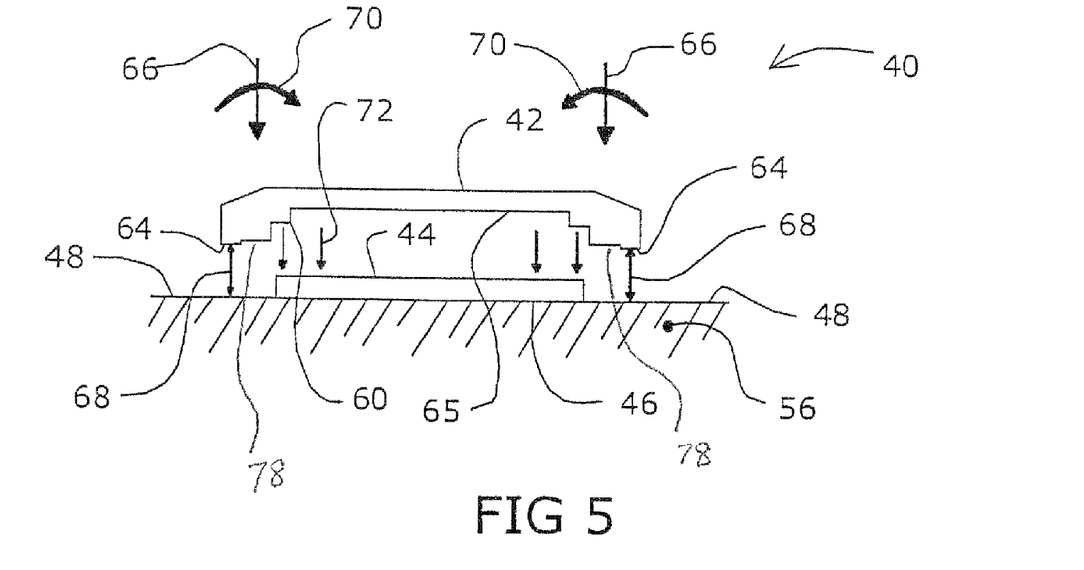
FIG. 5 is an exploded side cross-sectional view of the package of FIG. 2 taken along line 5-5 in FIG. 2.

The central die cavity 65 in recess 60 is offset from the dies 44 and any jumper wires 45 used to make electrical connections from the dies 44 to the leads 48, 50, 52 so that the recess 60 generally encloses and seals the dies 44 and any jumper wires 45 without damaging the same.

The periphery of recess 60 includes recesses 61, also shown in FIG. 5, shaped to allow the gate and drain leads 50, 52 to protrude from the ceramic base 46. Such recess 61 is preferably slightly shallower in depth than the thickness of the gate and drain leads 50, 52 to insure a secure clamping. The gate and drain leads 50, 52 can be 5 mils (0.127 mm) thick with the recess 61 about 0.5 mils (0.013 mm) shallower than that.

Figure 7:
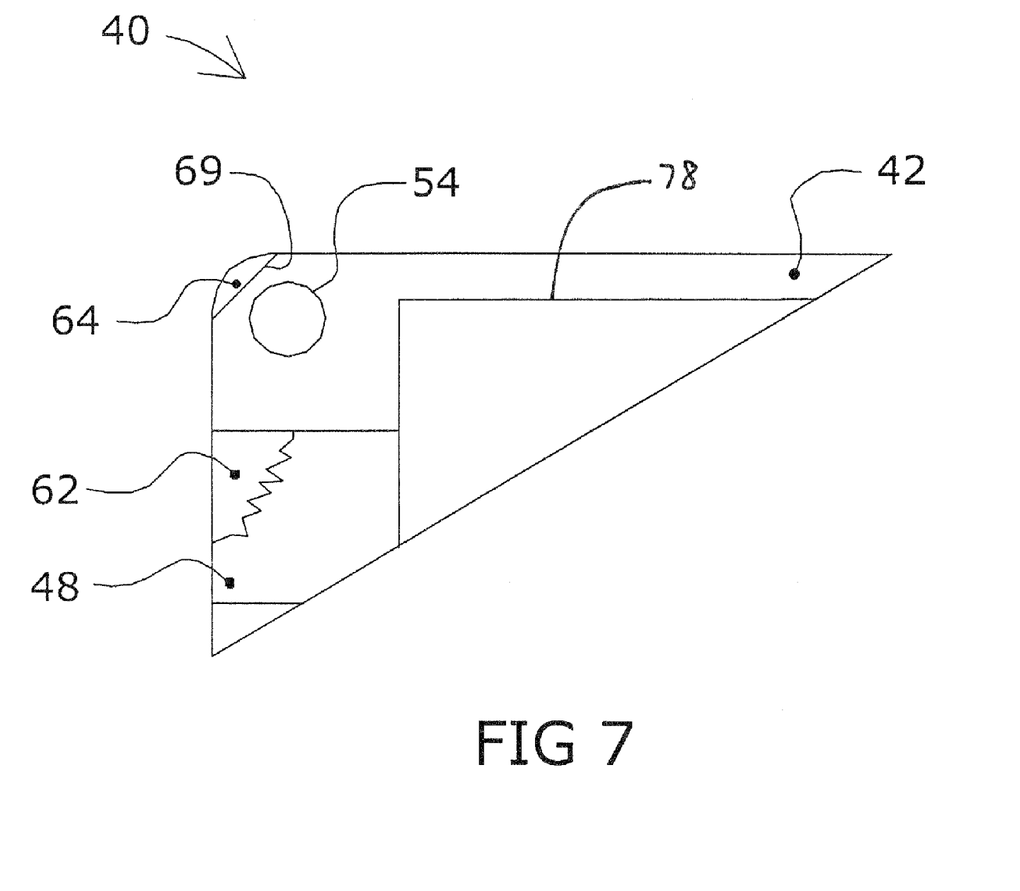
FIG. 7 is a detailed bottom plan view of a corner of the package of FIG. 2.

FIG. 5 is an exploded cross-sectional view of the RF power transistor package 40 taken along line 5-5 in FIG. 2. As shown previously, the cover 42 is shaped to contain the dies 44 and clamp the base 46 down onto a heat sink 56. The cover 42 also clamps the source leads 48 onto the heat sink 56. The source leads 48 are attached to the top surface of the ceramic base 46. The source leads 48 are then bent down around the edge of the ceramic base 46 to be in position to contact the upper surface of the heat sink 56. The cover 42 is shaped to bend the source leads 48 and receive them in outer recesses 62, as shown in FIG. 7, between the mounting holes 54.

Recess 60 is shaped to receive and contact the ceramic base 46 and further shaped to include and added recess or die cavity 65 shaped to offset the central portion of the underside of the cover from the dies 44 so as not to contact the dies 44, preventing damage to the dies 44 and jumper wires 45.

The cover 42 may also include corner bosses 64 protruding from the bottom surface 78 of the cover 42 located along an outer edge of the cover 42 next to and outwardly extending from and adjacent to each of the mounting holes 54. When the cover 42 is secured onto the heat sink 56, the combination of the downward bolt force 66 with the upward and offset supporting force 68 of the corner boss 64 creates a downward bending moment 70 in the cover 42 inward of the mounting bolts 58. The bending moments 70 on either side of the cover 42 balance against each other to spread the clamping force 72 across the peripheral recess 60.

In the embodiment that includes corner bosses 64, the bending moment 70 of the cover 42 will counteract any unwanted upward bowing that may be caused by the expansion or contraction of the heat sink 56 due to power/heat cycles. When the fasteners 58 are tightened, the corner bosses 64 bias the cover 42 to bow downward toward the ceramic base 46. Even when the heat sink 56 contracts during cooling, the bending moments 70 caused by the bosses 64 force the cover down, preventing the cover 42 from bowing up. Thus, the thermal performance of the RF power transistor 40 is maintained because the ceramic base 46 is kept in close contact with the heat sink 56 over a much greater number of power/heat cycles.

Figure 6:
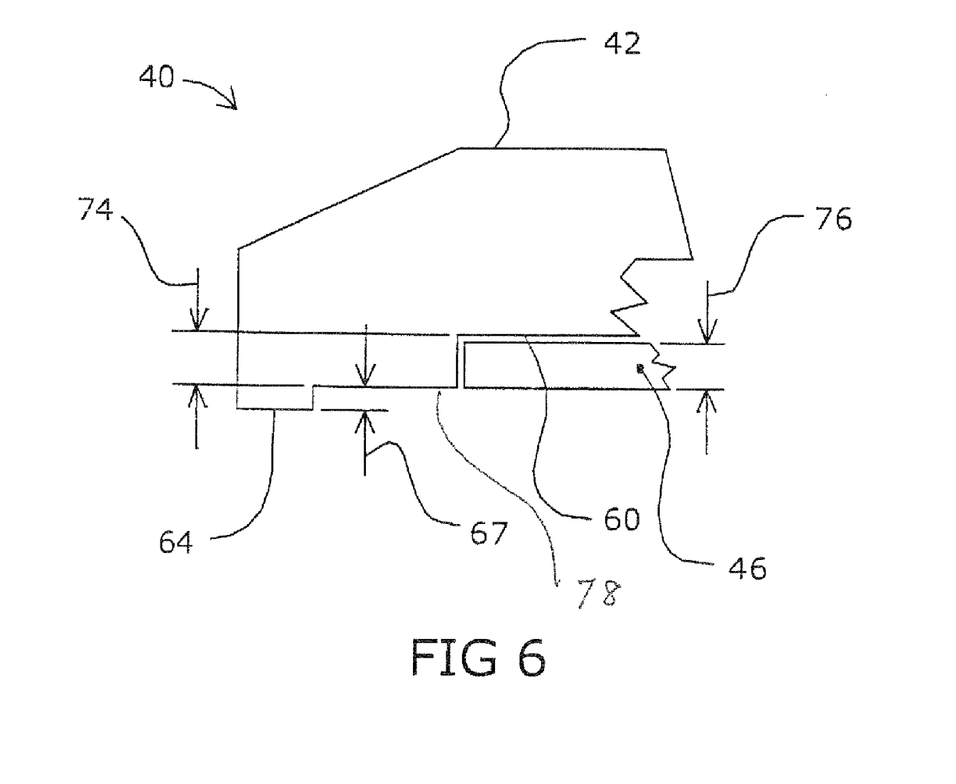
FIG. 6 is an enlarged view of a corner of the package as shown in FIG. 5.

FIG. 6 is a detailed side elevation view of a corner of the RF power transistor 40 showing the corner boss 64 and recess 60 relative to the ceramic base 46. As described above, the height 74 of the recess 60 is slightly less then the height 76 of the ceramic base 46. When the clamping force 72 shown in FIG. 5 is applied to the cover 42, this height difference creates a snug interference fit between the cover 42 and the ceramic base 46 helping to ensure a proper thermal contact between the ceramic base 46 and the heat sink 56, shown in FIG. 4.

The bosses 64, for example, may have a thickness 67 that protrudes 3-5 mils (0.076-0.127 mm) from the bottom surface 78 of the cover 42 with 4.5 mil (0.114 mm) thick bosses 64 shown here. As the bolts 58 in FIG. 5 are tightened, the bosses 64 force the cover 42 to bend.

FIG. 7 is a detailed bottom plan view of a corner of the RF power transistor package 40 showing the source lead 48 extending through a side recess 62 of the cover 42. The source lead 48 extends from the ceramic base 46 between the mounting holes 54. The depth of the side recess 62 may be sized to be slightly less than the thickness of the source lead 48. The source lead thickness may be around 5 mils (0.127 mm) with the depth of the side recess 62 sized to be about 0.5 mils (0.0127 mm) shallower. The height difference provides a snug interference fit for the source lead 48 between the cover 42 and the heat sink 56 shown in FIG. 4.

The corner boss 64 is shown positioned adjacent the mounting hole 54 and outwardly from the mounting hole 54 next to an outer edge of the cover 42. The tipping edge 69 of the corner boss 64 is arranged perpendicular to a diagonal line extending from opposite corners of the cover 42. By arranging tipping edges 69 of the corner bosses 64 in this manner, the bending moment 70 shown in FIG. 5 will bend the cover 42 toward the center of the cover 42, firmly securing the base 46 to the heat sink 56, as shown in FIG. 5, and firmly securing the source leads 48 and the gated and drain leads 50, 52 to the ceramic base 46.

Having illustrated and described the principles of our invention in a preferred embodiment thereof, it should be readily apparent to those skilled in the art that the invention can be modified in arrangement, detail and application without departing from such principles. While the embodiment described herein is especially useful in packaging RF power device, embodiments of the invention can be configured for use with lower frequency devices. We claim all modifications coming within the spirit and scope of the accompanying claims.

What is claimed is:

1. A power transistor package comprising:
   a rectangular ceramic base;
   one or more die affixed to an upper surface of the ceramic base;
   one or more source leads extending from at least one of a pair of opposite sides of the ceramic base;
   one or more gate and drain leads extending from at least one of a pair of opposite sides of the ceramic base; and
   a rectangular non-conductive unitary resilient cover overlying the ceramic base and including:
      a recess configured to receive the ceramic base and including a cavity to receive the one or more die, gate and drain leads and a portion of the source leads, the recess shaped to engage and press an outer periphery of the ceramic base against a heat sink;
      a rectangular marginal frame spaced outward from the recess to form a bottom surface along an outer edge of the non-conductive cover, the bottom surface of the marginal frame being parallel to and above an upper surface of the heat sink;
      four bolt holes for mounting bolts, each bolt hole arranged in one of four corners of the rectangular marginal frame to secure the ceramic base and source leads to the heat sink; and
      four separate bosses, each boss protruding from the bottom surface of one of the four corners of the rectangular marginal frame corresponding to each bolt hole and arranged outward of each of the bolt holes toward an outer edge of the cover to form a second bottom surface offsetting from the bottom surface of the marginal frame in a stair-stepped arrangement facing the heat sink and to serve as a pivot adjacent an outer periphery of the bottom surface of the rectangular marginal frame at each corner thereof, so that the rectangular non-conductive unitary resilient cover exerts a downward bending moment toward the heat sink inward of the mounting bolts for securing the non-conductive cover to the ceramic base.

2. The package of claim 1, wherein the recess includes a portion shaped to receive the ceramic base that has a depth less than the height of the ceramic base.

3. The package of claim 1, wherein the recess includes a portion shaped to receive a portion of the source leads that has a depth less than the thickness of the source leads.

4. The package of claim 3, wherein the portion shaped to receive a portion of the source leads is positioned between the bolt holes.

5. The package of claim 1, wherein the cover comprises a material having resistance to creep, high electrical insulation, high yield strength and low dielectric loss.

6. The package of claim 5, wherein the cover comprises a partially glass-filed polyetherimide.

7. The package of claim 5, wherein the cover comprises a partially glass-reinforced liquid crystal polymer.

8. A packaging system for an RF power transistor, comprising:
   a heat sink;
   a rectangular ceramic base including one or more die affixed to a prepared upper surface of the ceramic base, the ceramic base having a lower surface overlying the heat sink;
   source leads connected to and extending from opposite sides of the ceramic base;
   gate and drain leads connected to and extending from opposite sides of the ceramic base; and
   a non-conductive unitary resilient cover clamping the gate, drain and source leads to the ceramic base and clamping the ceramic base and portions of the source leads extending from the ceramic base onto the heat sink, the non-conductive unitary resilient cover being rectangular and including:
      a recess configured to receive the ceramic base and including a cavity to receive the one or more die, the gate and drain leads and portions of the source leads, the recess shaped to engage and press an outer periphery of the ceramic base against the heat sink;
      a rectangular marginal frame spaced outward from the recess to form a bottom surface along an outer edge of the non-conductive cover, the bottom surface being parallel to an upper surface of the heat sink and offset above the upper surface of the heat sink so that the recess has a depth less than a thickness of the ceramic base;
      fastener holes arranged in corners of the rectangular marginal frame to affix the cover to the heat sink; and
      separate protrusions from the bottom surface of the each corner of the rectangular marginal frame adjacent to the fastener holes and arranged outward of the fastener holes toward an outer edge of the cover to form a second bottom surface offsetting from the bottom surface of the marginal frame in a stair-stepped arrangement facing the heat sink and to serve as a pivot adjacent each fastener hole, so that the rectangular non-conductive unitary resilient cover exerts a downward bending moment toward the heat sink inward of each of the bolts for securing the non-conductive cover to the ceramic base.

9. The packaging system of claim 8, wherein the cover includes a first recess shaped to fit over the ceramic base and source leads, the first recess having a depth less than the height of the ceramic base.

10. The packaging system of claim 9, wherein the cover includes a second recess arranged within the first recess to offset a portion of the cover from the one or more die.

11. The packaging system of claim 8, wherein the protrusions each include a tipping edge aligned perpendicular to a diagonal extending from opposite corners of the rectangular ceramic base.

12. The package of claim 8, wherein the cover includes a portion shaped to receive a portion of the source leads that has a depth less than the thickness of the source leads.

13. A power transistor package comprising:
a rectangular ceramic base;
one or more die affixed to an upper surface of the ceramic base;
one or more source leads extending from at least one of a pair of opposite sides of the ceramic base;
one or more gate and drain leads extending from at least one of a pair of opposite sides of the ceramic base; and
a rectangular cover overlying the ceramic base and including:
a first undersurface having a first predefined depth from an upper surface of the cover, the first undersurface being spaced apart from the one or more die, thereby forming a die cavity to offset a central portion of an underside of the cover from the one or more die;
a second undersurface having a second predefined depth from the upper surface of the cover greater than the first predefined depth, the second undersurface extending laterally outward from the first undersurface and structured to directly contact at least corner portions of the ceramic base;
a third undersurface having a third predefined depth from the upper surface of the cover greater than the first and second predefined depths, the third undersurface extending laterally outward from the second undersurface and located along each of four entire outer edges of the rectangular cover;
four bolt holes for mounting bolts, each mounting bolt arranged in one of four corners of the cover extending through the third undersurface to secure the ceramic base and the one or more source leads to a heat sink, the third undersurface being adjacent to and outwardly extending from each of the bolt holes; and
four separate bosses protruding from the third undersurface, the bosses located outward of the bolt holes toward a periphery of the cover, wherein the four mounting bolts are arranged so that each boss serves as a pivot adjacent an outer periphery of the third undersurface of the cover adjacent each corner thereof, so that the cover exerts a downward bending moment toward the heat sink inward of the mounting bolts for securing the cover to the ceramic base.

14. The package of claim 13, wherein each of the four bosses comprises a corner boss diagonal across each corner and adjacent to one of the four bolt holes.

* * * * *

UNITED STATES PATENT AND TRADEMARK OFFICE
CERTIFICATE OF CORRECTION

PATENT NO. : 7,569,927 B2  Page 1 of 1
APPLICATION NO. : 11/233180
DATED : August 4, 2009
INVENTOR(S) : Richard B. Frey

It is certified that error appears in the above-identified patent and that said Letters Patent is hereby corrected as shown below:

Column 8, line 5, change "comer" to --corner--;

Column 8, line 14, change "comers" to --corners--.

Signed and Sealed this

Ninth Day of March, 2010

David J. Kappos
*Director of the United States Patent and Trademark Office*